United States Patent
Chien et al.

(10) Patent No.: US 6,194,260 B1
(45) Date of Patent: Feb. 27, 2001

(54) METHOD OF FORMING A CMOS SENSOR

(75) Inventors: Cheng-Hung Chien, Yung-Ho; Chih-Hua Lee, Taoyuan, both of (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/324,615

(22) Filed: Jun. 2, 1999

(51) Int. Cl.$^7$ ................................................ H01L 21/8238
(52) U.S. Cl. .............................................. 438/232; 438/57
(58) Field of Search ........................... 438/232, 229–231, 438/48, 56, 57, 58, 59, 60, 73, 75, 200, 237

(56) References Cited

U.S. PATENT DOCUMENTS 6,096,573 * 8/2000 Chen ...................................... 438/48

* cited by examiner

Primary Examiner—Charles Bowers
Assistant Examiner—Craig Thompson
(74) Attorney, Agent, or Firm—Martine Penilla & Kim, LLP

(57) ABSTRACT

A method of forming a CMOS sensor. Shallow first doped regions are formed in a provided substrate beside a gate electrode which is on the substrate. One of the shallow first doped region is defined as a source/drain area. Another of the shallow first doped region is defined as a sensor area. A spacer is formed on the sidewall of the gate electrode. A second doped region is formed within the predetermined sensor area by implanting. In the predetermined sensor area, the second doped region is deeper than the first doped region. The sensor region is composed of the first doped region and the second doped region.

4 Claims, 4 Drawing Sheets

METHOD OF FORMING A CMOS SENSOR

BACKGROUND OF THE INVENTION

1. Field of the Invention

The invention relates in general to a fabrication of semiconductor integrated circuits (ICs), and more particularly to a method of forming a complementary metal-oxide semiconductor (CMOS) sensor.

2. Description of the Related Art

Charge-coupled devices (CCDs) have been the mainstay of conventional imaging circuits for converting light into an electrical signal that represents the intensity of the energy. CCD applications include monitors, transcription machines and cameras. Although CCDs have many strengths, CCDs use is restricted by their high cost and their volume. To reduce their cost, dimensions and energy consumption, a CMOS photo diode device has been develop. Because a CMOS photo diode device can be produced using conventional techniques, the cost and the volume of the sensor can be reduced. CMOS photo diode applications include PC cameras, digital cameras, etc.

A photo diode based on the theorem of a P-N junction can convert light into an electrical signal. Before energy in the form of photons strikes the photo diode, there is an electric field in the P-N junction. The electrons in N region do not diffuse towards P region and the holes in P region do not diffuse towards N region. When enough light strikes the photo diode, the light creates a number of electron-hole pairs. The electrons and the holes diffuse towards the P-N junction. When the electrons and the holes reach the P-N junction as a result of the effect of the inner electric field across the junction, the electrons flow to the N region and the holes flow to the P region. Thus a current is induced between the P-N junction electrodes. Ideally, a photo diode in the dark is an open-circuit. In other words there is no current induced by light while a photo diode is in the dark.

FIG. 1 is a schematic, cross-sectional view of a portion of a semiconductor device showing a conventional CMOS sensor. In FIG. 1, the conventional CMOS sensor includes a P-type substrate 100, a field oxide layer 104, a P-type well 110, a gate structure 120, an N-type source/drain region 122, an N-type sensor region 124, an depletion region 126, and a borophosphosilicate glass/silicon nitride glass dielectric layer 134.

When a light beam 140 passes through the depletion region 126 which works as a P-N junction, the depletion region 126 is excited and a number of electron-hole pairs are created. Thus the light is converted into an electric signal.

However, with respect to a CMOS image sensor, transmittance of light for the semiconductor structure used in a semiconductor image sensor is an important factor that seriously influences the quality of the image sensor. For example, it the imperative that the light transmittance is high enough. Only a high transmittance enables the light to arrive at the depletion region with a sufficiently high electric field in the semiconductor substrate. Upon arrival, the transmitted light induces electron-hole pairs due to excitation of photo-energy and thereby produces current in the intrinsic depletion region when light with varied wavelength transmits into the depletion region.

In general, the depletion region of a CMOS image sensor is formed far away from the surface of the semiconductor substrate. Since the wavelength of blue light, about 460 nanometers, is shorter than that of red light and green light, most of the blue light passing through the CMOS image sensor cannot arrive at the depletion region. The poor transmittance of the blue light causes the semiconductor substrate to receive insufficient light energy for current induction, leading to erroneous information.

Furthermore, a sensor region of a conventional CMOS image sensor is formed by implantation. The sensor region and the source/drain region of the CMOS image sensor are formed at the same implanting step so that the sensor region and the source/drain region have the same impurity varieties and the same implanting concentration. Arsenic (As) is usually doped into the substrate to form the source/drain region with a concentration of about $1 \times 10^{15}$ atoms/cm$^2$. As is heavier than phosphorous (P) and is doped into the substrate with a high energy of about 80 Kev so that the sensor region may be damaged from the high energy and the heavy atoms. The damage to the sensor region induces substrate leakage.

SUMMARY OF THE INVENTION

The invention provides method of forming a CMOS sensor. Shallow first doped regions are formed in a provided substrate beside a gate electrode which is on the substrate. One of the shallow first doped region is defined as a source/drain area. Another of the shallow first doped region is defined as a sensor area. A spacer is formed on the sidewall of the gate electrode. A first mask is provided to expose a part of the predetermined sensor area. A second doped region is formed within the predetermined sensor area by implanting. In the predetermined sensor area, the second doped region is deeper than the first doped region. The sensor region is composed of the first doped region and the second doped region. The shallow first doped region can enhance the response ability for blue light passing through the sensor region. The deep second doped can maintain the response ability for red light and for green light passing through the sensor region.

A second mask is provided to expose the predetermined source/drain area. A second doped region within the predetermined source/drain area is thus formed by implanting. The first doped region and the second doped region within the predetermined source/drain area constitute a source drain region with a lightly doped drain (LDD) region.

The invention provides a method for forming a CMOS sensor, in which the steps of forming the sensor region and the steps of forming the source/drain region are different. The source/drain region may be formed after forming the sensor region or before forming the sensor region. The first doped region and the second doped region within the sensor region contain phosphorus as impurity without the damage from implanting arsenic. The third doped region within the source/drain region contains arsenic as impurity, by which the conductivity of the source/drain region can be maintained.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

FIGS. 2A to 2E are schematic, cross-sectional views of a portion of a semiconductor device showing a CMOS sensor according to one preferred embodiment of the invention.

Figure 1:
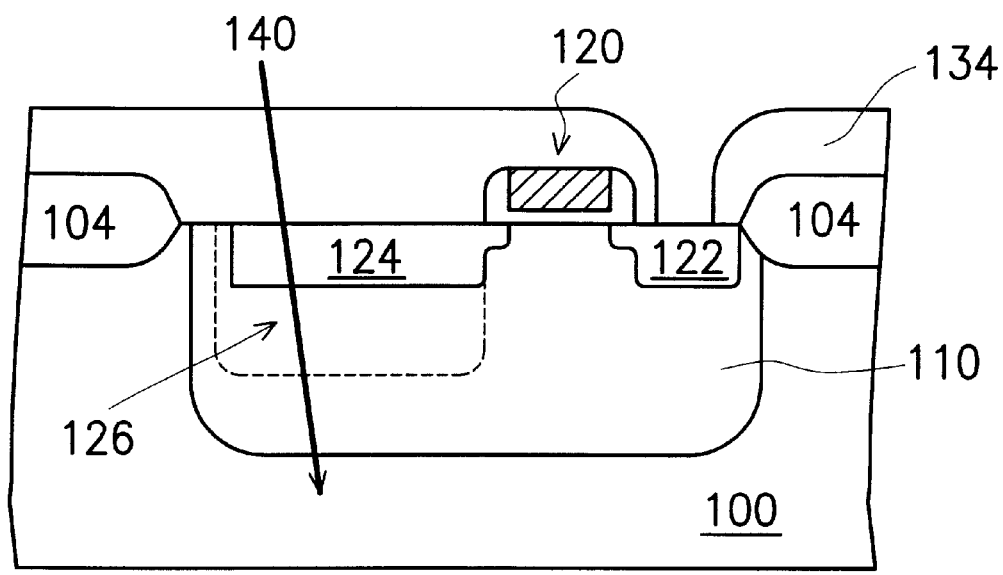
FIG. 1 is a schematic, cross-sectional view of a portion of a semiconductor device showing a conventional CMOS sensor.
Figure 2A:
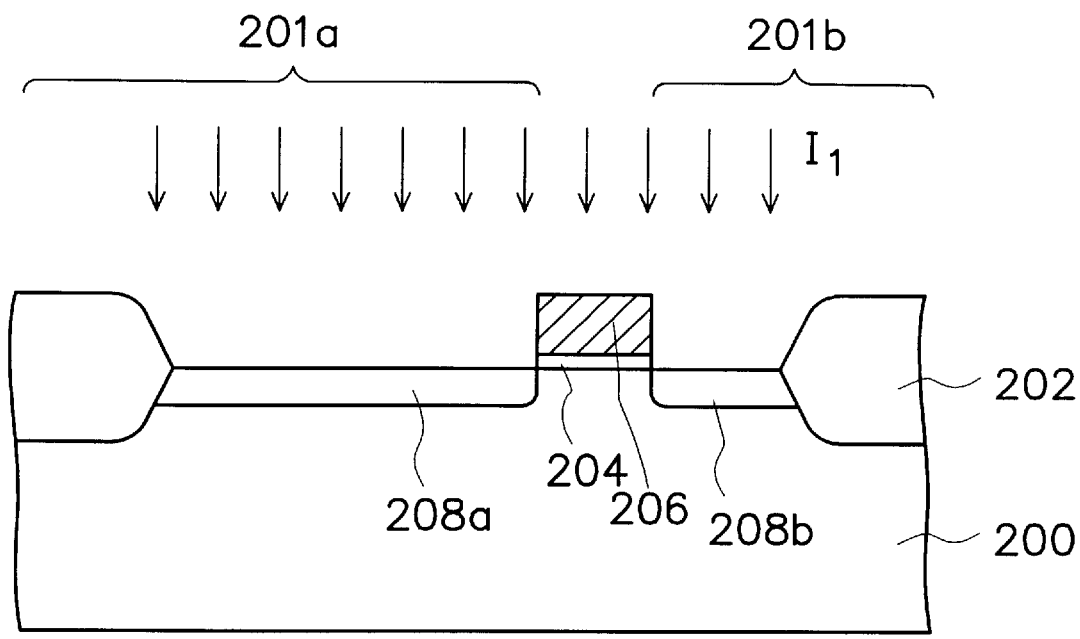
FIGS. 2A to 2E are schematic, cross-sectional views of a portion of a semiconductor device showing a CMOS sensor according to one preferred embodiment of the invention.

In FIG. 2A, a substrate 200 having an isolating structure 202 is provided. The substrate 200 is at least divided into two portions, 201a and 201b. Area 201a is designated as a region in which a sensor region will be formed. Area 201b is designated as a region in which a source/drain region will be formed. Furthermore, a gate oxide layer 204 and a gate electrode layer 206 are formed and patterned on the substrate 200. Although the gate electrode 206 shown in the figure is a mono-layer structure, the gate electrode 206 actually may include a polysilicon layer and a tungsten silicide layer.

An implanting process $I_1$ is performed to form first doped regions 208a and 208b in the substrate 200 using the gate electrode 206 as a mask with an energy of about 40 Kev. The first doped region 208a is positioned within the predetermined sensor area 201a. The first doped region 208b is positioned within the predetermined source/drain area 201b. The impurity implanted into the first doped regions 208a, 208b comprises phosphorus (P) with a dosage of about $1 \times 10^{13}$ atoms/cm$^2$.

Figure 2B:
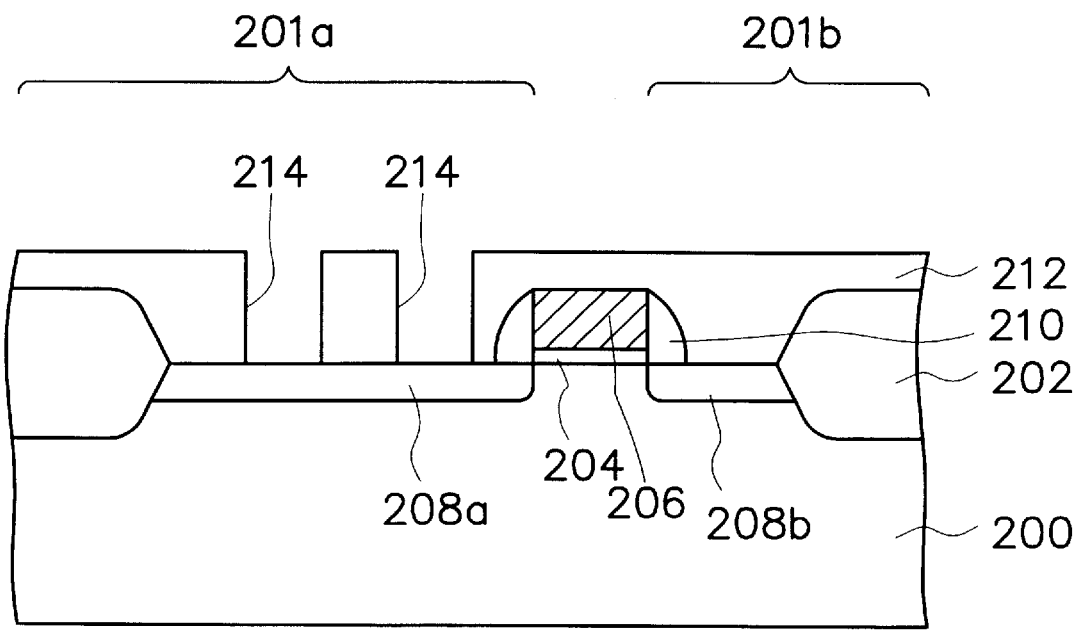

In FIG. 2B, a spacer 210 is formed on the sidewall of the gate electrode 206. A first mask 212 is provided over the substrate 200. An opening 214 of the first mask exposes a part of the first doped region 208a within the predetermined sensor area 201a.

Figure 2C:
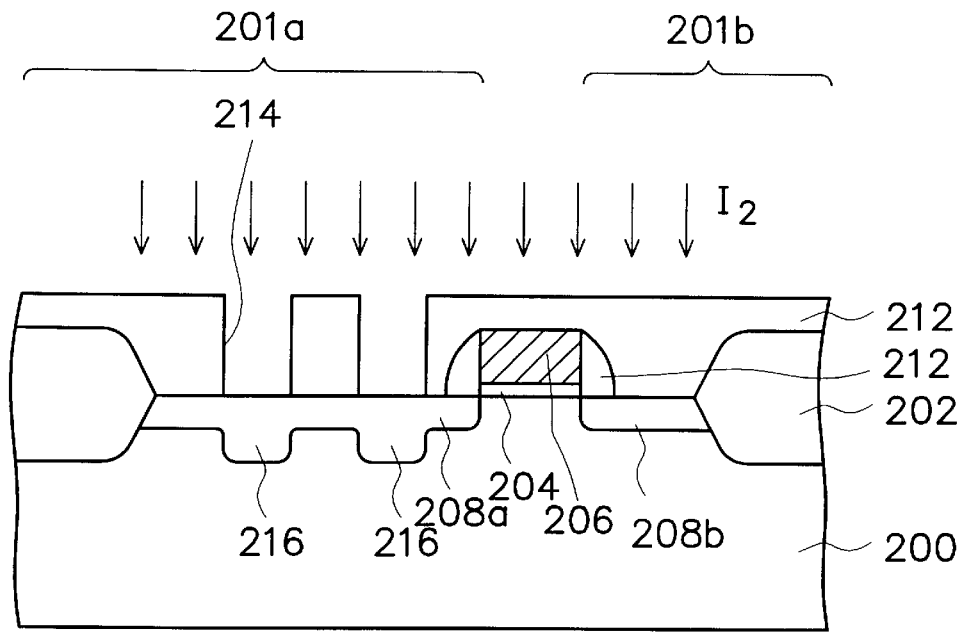

In FIG. 2C, a implanting process 12 is performed using an implanting energy of about 70 Kev to implant impurities such as phosphorus through the opening 214 into the substrate 200 to form a second doped region 216. Within the predetermined sensor area, the second doped region 216 is deeper than the first doped region 208a. An impurity concentration of the second doped region is about $1 \times 10^{13}$ atoms/cm$^2$. The first doped region 208a and the second doped region constitute a sensor region with a dentoid profile. The first doped region 208a is shallow for enhancing frequency response of blue light. The second doped region 216, which is deeper than the first doped region 208a, is used for enhancing frequency response of red light and green light.

Figure 2D:
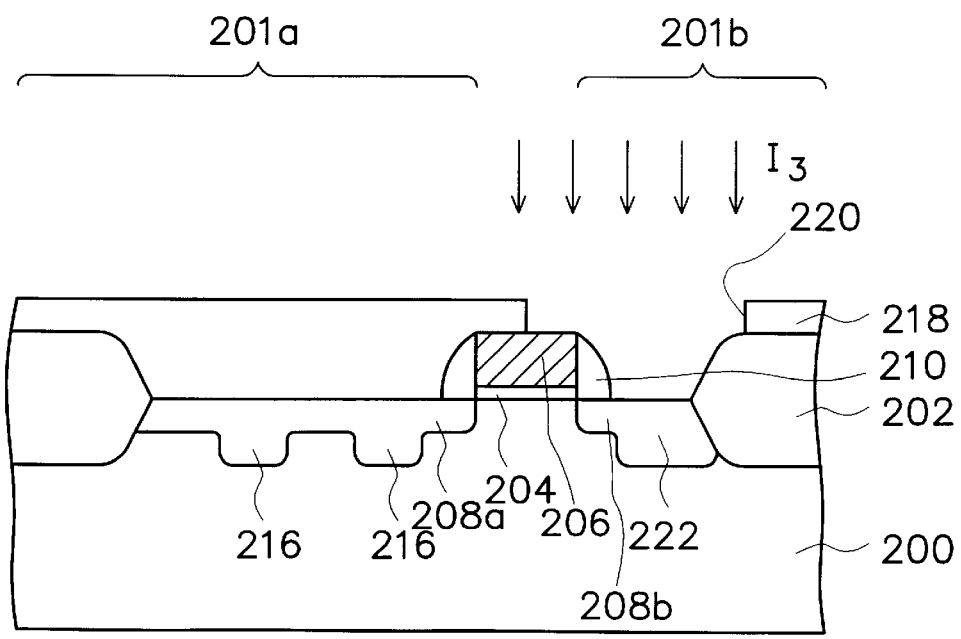

In FIG. 2D, the mask 212 is removed. Another mask 218 with an opening 220 is provided over the substrate 200. The opening 220 exposes the predetermined source/drain area 201b of the substrate 200. An implanting process 13 is performed with a implanting energy of about 80 Kev to form a second doped region 222 in the predetermined source/drain area 201b using arsenic as an impurity. The concentration of the impurity is about $1 \times 10^{15}$ atoms/cm$^2$. Within the predetermined source/drain area 201b of the substrate 200, the first doped region 208b and the second doped region 222 constitute a source/drain region with a lightly doped drain (LDD) structure.

Figure 2E:
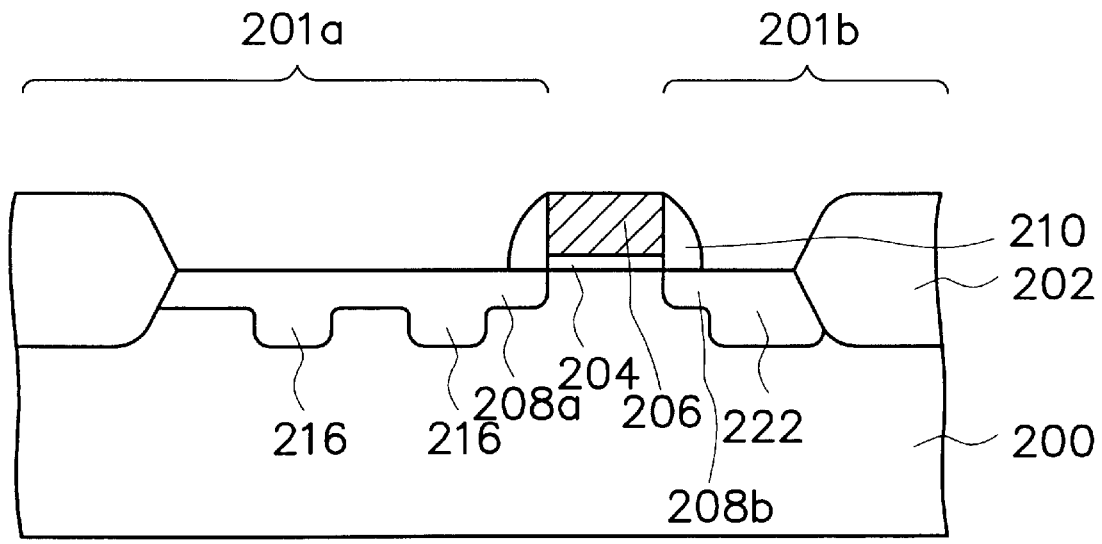
Figure 3:
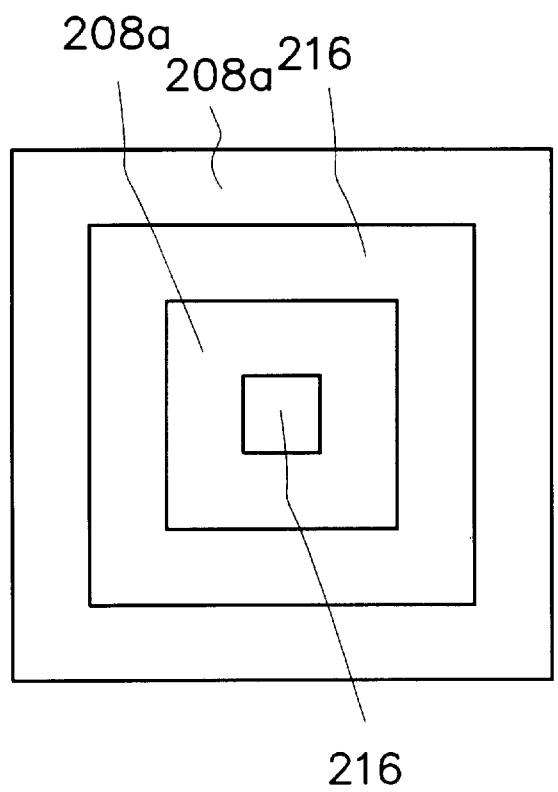
FIG. 3 is a top view showing the layout structure of a sensor region of the CMOS sensor shown in FIG. 2E.

In FIG. 2E, the mask 218 is removed. The sensor region and the source/drain region of the CMOS sensor are complete. FIG. 3 is a top view showing the layout structure of a sensor region of the CMOS sensor shown in FIG. 2E. As shown in FIG. 3, the first doped region 208a and the second doped region 216 are alternatingly placed.

The invention provides a method of forming a CMOS sensor. The CMOS structure comprises a source/drain region and a sensor region. The source/drain region is implanted using arsenic for good conductivity. The sensor region is implanted without arsenic for preventing the sensor region from being damaged by the heavy impurity, arsenic. Furthermore, the sensor region has a dentoid profile comprising a shallow first doped region and a deep second doped region.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of forming a CMOS sensor, which is performed on a substrate having a sensor area and a source/drain area, comprising the steps of:

forming a gate electrode on the substrate;

forming two first doped regions in the substrate beside the gate electrode, wherein one of the first doped regions is positioned in the sensor area and another first doped region is positioned in the source/drain area;

forming a spacer on a sidewall of the a gate electrode;

forming a second doped region within the sensor area, wherein the second doped region and one of the first doped regions constitute a sensor region; and forming a third doped region within the source/drain area, wherein the third doped region and another first doped region constitute a source/drain region.

2. The method according to claim 1, wherein the first doped region comprises phosphorus with a concentration of about $1 \times 10^{13}$ atoms/cm$^2$, which is implanted with an energy of about 40 Kev.

3. The method according to claim 1, wherein the second doped region comprises phosphorus with a concentration of about $1 \times 10^{13}$ atoms/cm$^2$, which is implanted with an energy of about 70 Kev.

4. The method according to claim 1, wherein the third doped region comprises arsenic with a concentration of about $1 \times 10^{15}$ atoms/cm$^2$, which is implanted with an energy of about 80 Kev.

* * * * *